United States Patent
Tran et al.

(10) Patent No.: US 8,126,079 B1
(45) Date of Patent: Feb. 28, 2012

(54) HIGH-SPEED SERIAL DATA SIGNAL INTERFACE CIRCUITRY WITH MULTI-DATA-RATE SWITCHING CAPABILITY

(75) Inventors: Thungoc M. Tran, San Jose, CA (US); Sergey Shumarayev, Los Altos Hills, CA (US); Tim Tri Hoang, San Jose, CA (US); Weiqi Ding, Fremont, CA (US); Wilson Wong, San Francisco, CA (US); Allen Chan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1263 days.

(21) Appl. No.: 11/824,862

(22) Filed: Jul. 3, 2007

(51) Int. Cl.
 *H04L 27/00* (2006.01)
(52) U.S. Cl. ............... 375/295; 331/2; 331/11; 331/34; 327/157
(58) Field of Classification Search .............. 375/295; 331/2, 34, 11; 327/157
 See application file for complete search history.

(56) References Cited

U.S. PATENT DOCUMENTS

| | | | | |
|---|---|---|---|---|
| 4,891,774 | A * | 1/1990 | Bradley | 708/103 |
| 5,734,301 | A * | 3/1998 | Lee et al. | 331/2 |
| 6,566,967 | B1 * | 5/2003 | Anumula et al. | 331/11 |
| 7,342,426 | B2 * | 3/2008 | Kurd et al. | 327/156 |
| 7,821,343 | B1 * | 10/2010 | Wong et al. | 331/2 |
| 7,860,203 | B1 | 12/2010 | Shumarayev et al. | |
| 2006/0233172 | A1 * | 10/2006 | Venkata et al. | 370/391 |
| 2007/0046388 | A1 * | 3/2007 | Sanders | 331/179 |

* cited by examiner

*Primary Examiner* — David C. Payne
*Assistant Examiner* — Tanmay Shah
(74) *Attorney, Agent, or Firm* — Ropes & Gray LLP; Jeffrey H. Ingerman (57) ABSTRACT

High-speed serial data signal transmitter and/or receiver circuitry is able to dynamically switch between handling data at two (or more) different data rates. Such a switch can be made very rapidly and with no requirement for reprogramming or reconfiguring the circuitry. Circuitry for glitchlessly switching between clock signals having different frequencies is also provided and may be used in the above-mentioned transmitter and/or receiver circuitry.

23 Claims, 9 Drawing Sheets

HIGH-SPEED SERIAL DATA SIGNAL INTERFACE CIRCUITRY WITH MULTI-DATA-RATE SWITCHING CAPABILITY

BACKGROUND OF THE INVENTION

This invention relates to circuitry for high-speed serial data communication, and more particularly to such circuitry that can switch very quickly from one data rate to another different data rate.

Some emerging high-speed serial data communication protocols (e.g., industry standards) call for circuitry that is able to switch very rapidly from communication at one data rate to communication at another different data rate. For example, the industry standard known as PCI Express Generation 2 ("PCIE Gen 2") requires circuitry that can switch very rapidly from 2.5 giga-bits per second ("2.5 GBPS") to 5.0 giga-bits per second ("5 GBPS"), and vice-versa. In order to support such multi-data-rate signalling, both transmitter circuitry and receiver circuitry with this capability is needed. In some instances, an integrated circuit (such as a programmable logic device ("PLD")) may be provided with both transmitter and receiver components so that the IC can be used as either a transmitter, a receiver, or both. A device with both transmitter and receiver capabilities may be referred to as a transceiver.

SUMMARY OF THE INVENTION

High-speed serial data signal transmitter circuitry in accordance with the invention may include phase-locked loop (PLL) circuitry for producing a clock signal. This PLL is preferably set to operate at the frequency that is required to support the highest data rate that the transmitter may be required to operate at in a multi-data-rate communication protocol. Circuitry downstream from the PLL is provided for dividing the frequency of the PLL output clock signal by a dynamically selectable factor. Selectable values of this factor may include 1 and another value such as 2 (or more), which other value is appropriate for modifying the PLL output clock signal frequency to a lower frequency that supports operation of the transmitter at another data rate (not the highest data rate) required by the multi-data-rate communication protocol. Switching between the above-mentioned different frequencies is preferably performed glitchlessly. The above-mentioned circuitry down-stream from the PLL may include circuitry for generating the lower frequency signal from the PLL output clock signal, and a multiplexer for dynamically selecting between the PLL output clock signal and the lower frequency signal. Timing of switching of the multiplexer may be controlled to ensure that the output signal of the multiplexer is glitchless. This may be done, for example, by monitoring clock signal polarities so that the multiplexer is allowed to switch only after the high frequency signal has gone to a same polarity that the low frequency signal already has.

High-speed serial data signal receiver circuitry in accordance with the invention may again include PLL circuitry for producing a clock signal. This PLL is again preferably set to operate at the frequency that is required to support the highest data rate that the receiver may be required to operate at in support of a multi-data-rate communication protocol. The receiver circuitry may also include a data loop that feeds the clock signal back to the PLL through a phase detector comparison with an incoming data signal. Between the PLL output and the phase detector, the data loop includes circuitry for dividing the frequency of the PLL output clock signal by a dynamically selectable factor. Selectable values of this factor can include 1 and another value such as 2 (or more), which other value is appropriate for modifying the PLL output clock signal frequency to a lower frequency that supports operation of the receiver at another data rate (not the highest data rate) required by the multi-data-rate communication protocol. Switching between the above-mentioned different frequencies is preferably performed glitchlessly. This can be accomplished similarly to what is described above for transmitter aspects of the invention. The circuitry for dividing frequency by a dynamically selectable factor can also be implemented similarly to what is described above in relation to the transmitter aspects.

Further features of the invention, its nature and various advantages, will be more apparent from the accompanying drawings and the following detailed description.

DETAILED DESCRIPTION

Figure 1:
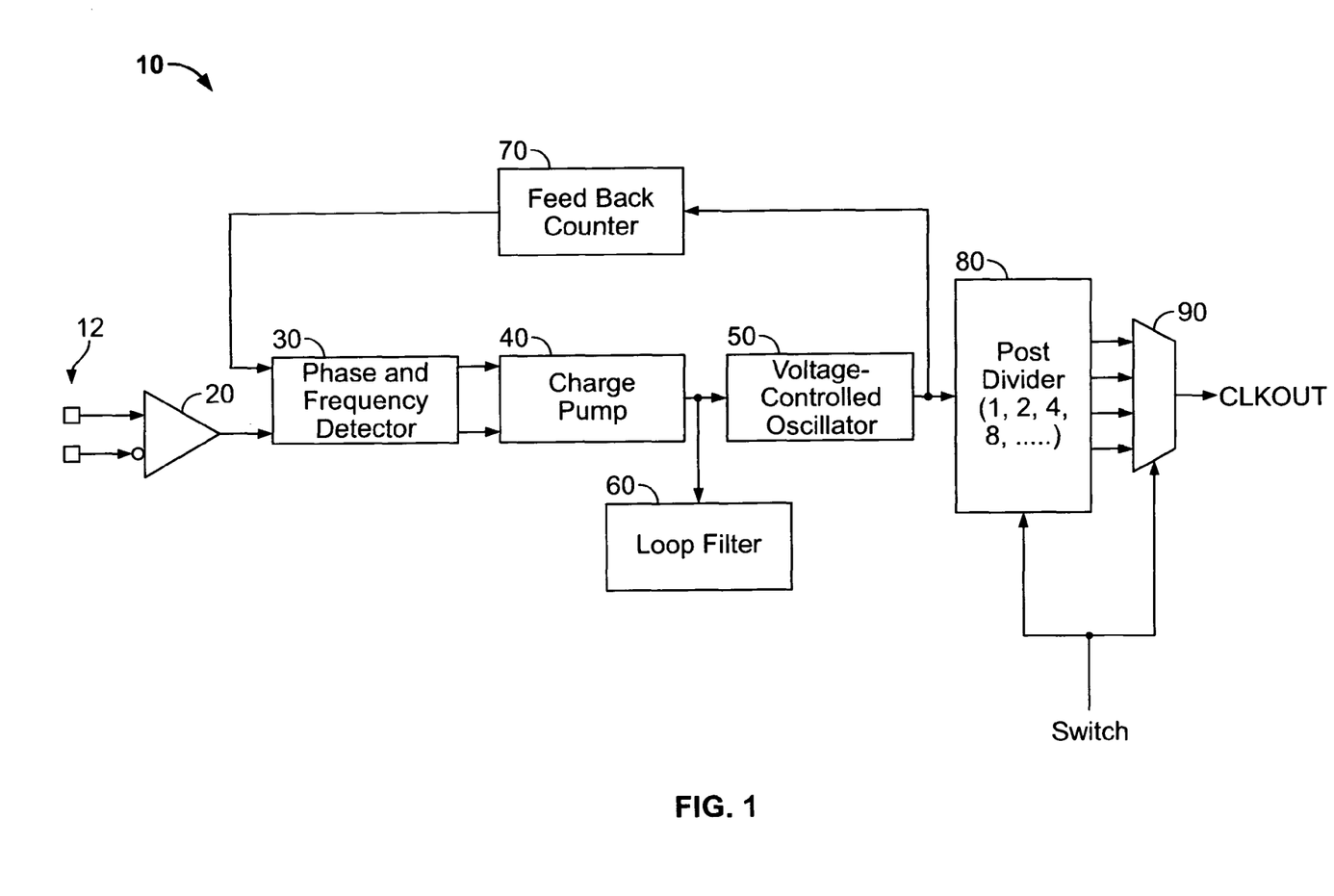
FIG. 1 is a simplified block diagram of an illustrative embodiment of circuitry in accordance with the invention.
Figure 2:
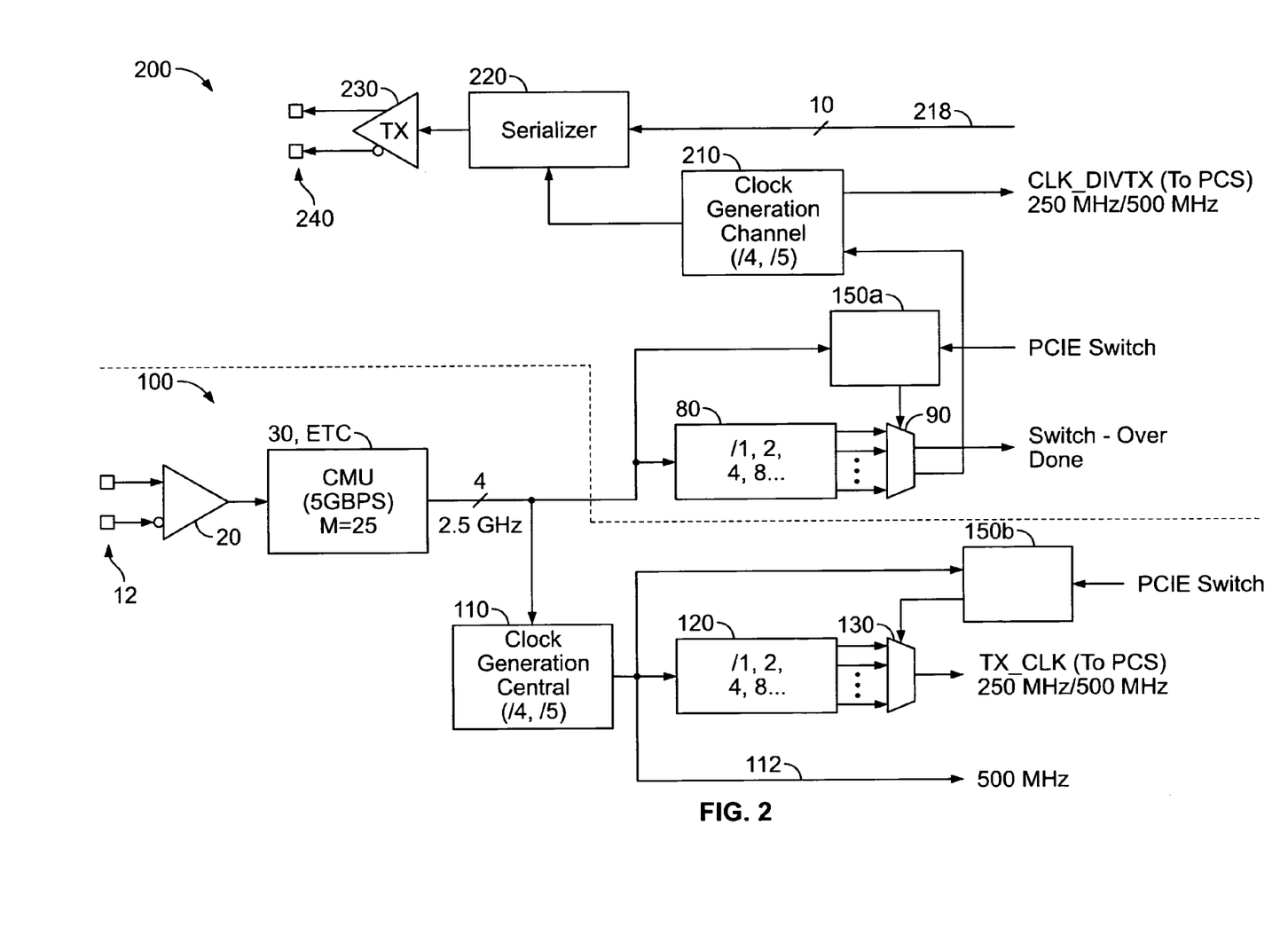
FIG. 2 is a simplified block diagram of an illustrative embodiment of additional circuitry in accordance with the invention.

Various aspects of illustrative transmitter circuitry in accordance with the invention are shown in FIGS. 1 and 2. FIG. 1 shows circuitry for changing the frequency of a clock signal (CLKOUT) that can be used to control the rate at which serial data is output by one or more transmitters. FIG. 2 shows the FIG. 1 type circuitry in use in an illustrative larger context.

In FIG. 1 a reference clock signal (e.g., at 100 MHz) is applied in differential form to input terminals 12. Input buffer 20 converts that signal to a single-ended reference clock signal (possibly additionally changing the frequency of the incoming signal). The single-ended signal is applied to one input terminal of phase-frequency detector ("PFD") circuitry 30. (In an alternative embodiment, input buffer 20 may not convert the reference clock signal to single-ended form, but may instead pass the reference clock signal on in differential form.) The other input to PFD circuitry 30 is the output signal of feedback counter circuitry 70. PFD 30 compares the phase and frequency of the two signals that are applied to it, and produces output signals indicative of whether the output signal of VCO 50 needs to be speeded up or slowed down in order for the output of counter 70 to better match the output of buffer 20.

The output signals of PFD 30 are applied to charge pump ("CP") circuit 40 to cause CP 40 to correspondingly increase or decrease its output voltage. The output signal of CP 40 (with a filtering effect provided by loop filter circuit 60) is applied to voltage-controlled oscillator ("VCO") circuit 50 to cause the VCO to correspondingly increase or decrease the frequency of its oscillating output signal.

The output signal of VCO 50 is applied to feedback counter 70 (which acts as a frequency divider), and also to post divider circuitry 80. It will be apparent from the foregoing that the circuitry upstream from divider 80 acts as phase-locked loop ("PLL") circuitry (which may be referred to as PLL 10). PLL 10 produces an output clock signal having a well-regulated frequency that is a function (typically a multiple) of the frequency of the clock signal applied to input terminals 12. In accordance with the present invention, PLL 10 is typically operated to produce an output signal having the highest frequency that will be needed for multi-data-rate operation in accordance with the invention. For example, in the case of PCIE Gen 2, the output signal of PLL 10 preferably has a frequency that can be used to support a data rate of 5 GBPS.

Post divider circuit 80 typically provides to one of its outputs the signal that it receives from PLL 10 with no change in frequency. In addition, circuit 80 provides to one or more other outputs the output signal of PLL 10 after frequency division by a factor such as 2, 4, 8, etc., respectively. In the case of PCIE Gen 2, for example, one output of circuit 80 may be a signal that supports a 5 GBPS data rate, and another output of circuit 80 may be a signal that supports a 2.5 GBPS data rate. Thus the first-mentioned output of circuit 80 may be the output of PLL 10 with no frequency division, while the second-mentioned output of circuit 80 may be the output of PLL 10 after frequency division by a factor of 2.

Multiplexer ("mux") 90 can select either (or any) of the outputs of circuit 80 to be the final CLKOUT signal, which is the signal used to establish the output data rate of serial data transmitter circuitry that is associated with the FIG. 1 circuitry. The signal (or signals) labelled "switch" in FIG. 1 dynamically control which of its inputs mux 90 will select as the CLKOUT signal. In accordance with another possible feature of the invention, transitions in the switch signal (or changes made in the selection made by mux 90 in response to such transitions) are preferably timed relative to features of one or more clock signals applied to mux 90 so that any change in the frequency of the CLKOUT signal is effected without causing "glitches" in the CLKOUT signal. (A glitch is typically characterized by transitions in the CLKOUT signal that are too close to one another in time.) Illustrative "de-glitch" circuitry for this purpose is shown and described later in this specification.

From the foregoing it will be appreciated that to change transmitter data rates, it is only necessary to send a "switch" command to select the frequency division that is required to support the next data transfer. It is not necessary to power down any circuitry, to programmably reconfigure any circuitry, or to reset the communication link or any associated system. The "switch" signal is preferably a dynamic signal, not a signal that requires programming of circuitry to set its level or reprogramming of circuitry to change its level.

Considering further the illustrative example of supporting PCIE Gen 2 (or "PCIE-2"), transmitter PLL 10 (or TXPLL 10) can be configured for only 2.5 GHz (the CLKOUT signal frequency needed to support a 5 GBPS data rate). The input reference clock 12 frequency can be constant (e.g., at 100 MHz). The FIG. 1 circuitry will also provide 1.25 GHz for PCIE (or PCIE-1; 2.5 GBPS data rate) by using the divide-by-2 option of divider 80. The control signal (switch) of mux 90 allows dynamic switching between PCIE-2 and PCIE-1 operation. PCIE-2 is signalling at the highest speed. PCIE employs a divided-down clock. The CLKOUT signal can be distributed to more than one transmitter channel (e.g., four or eight transmitter channels) for synchronous operation of more than one such channel. The above-mentioned de-glitch feature can be added to make sure that there is no glitch on the high-speed/low-speed clock (CLKOUT) during clock switching. Once the switch-over operation is complete, the mux control (de-glitch) circuit can send a "switch-done" status signal out to other circuitry if desired.

FIG. 2 shows use of circuitry of the type that is shown in FIG. 1 in an illustrative larger context. FIG. 2 continues to refer to the example of circuitry that is capable of switching between PCIE-1 and PCIE-2, but it will continue to be understood that this is only an illustration and that the invention is equally applicable to switching between other data rates in accordance with other communication protocols (e.g., between OC48 (2.488 GBPS) and OC12 (1.244 GPBS)).

In FIG. 2 the circuitry below the dotted line may be part of so-called clock management unit ("CMU") circuitry 100. The circuitry 200 above the dotted line may be part of a data transmitter channel. A CMU 100 may support more than one transmitter channel. Thus depicted channel 200 may be only a representative one of several such channels that are supported by CMU 100. FIG. 2 is also oriented toward showing components that are in the physical media attachment ("PMA") portions of the depicted circuitry. Such PMA circuitry may connect to associated protocol coding sublayer ("PCS") circuitry. In a PLD embodiment of the invention, the PCS circuitry may in turn connect to programmable logic core circuitry of the PLD. Examples of PLDs that include all of these various aspects are shown in Shumarayev et al. U.S. patent application Ser. No. 11/725,653, filed Mar. 19, 2007.

FIG. 2 shows again elements 12, 20, 30 (etc.), 80, and 90 from FIG. 1. Consistent with the PCIE-1/2 example, FIG. 2 shows buffer 20 outputting a reference clock signal at 100 MHz, and CMU circuitry 30, etc., multiplying that frequency by 25 (to 2.5 GHz) to support a serial data rate of 5 GBPS. (As in the case of FIG. 1, in an alternative embodiment, input buffer 20 may output a differential signal pair rather than a single-ended signal.) FIG. 2 shows divider 80 dividing the 2.5 GHz frequency by 2 (among other possibilities, including division by 1 (no actual frequency division)), and mux 90 able to select either the divided or un-divided frequency output signal for application to channel 200. FIG. 2 also shows de-glitch circuit 150*a*, which is responsive to a PCIE switch request signal and the clock output signal of CMU 30, etc., and which controls when mux 90 can actually change state to avoid glitches in its output signal. FIG. 2 also shows mux 90 producing a switch-over done signal to indicate when it has completed switching its main CLKOUT signal from one frequency to another.

FIG. 2 also shows that the CLKOUT signal from mux 90 is applied to clock generation circuitry 210 in channel 200. Circuitry 210 can divide the frequency of the CLKOUT signal by a selectable factor such as 4 or 5 to produce a word-rate (relatively slow) clock signal that is applied to the parallel side of serializer 220 and also to PCS circuitry of the channel. This signal is labelled 250 MHz/500 MHz in the upper part of FIG. 2, these being its two possible frequency values when circuitry 210 is dividing its received signal frequency by 5.

These divided-frequency signals control the rate at which successive 8-bit or 10-bit words are applied in parallel (via leads 218) to the parallel side of serializer 220. Circuitry 210 also applies a higher-frequency (bit-rate) clock signal to the serial side of serializer 220.

Serializer 220 uses the word-rate clock signal from circuitry 210 to accept successive parallel data words from leads 218. Serializer 220 uses the bit-rate clock signal from circuitry 210 to scan out the bits of each such word, one after another, at the serial data output rate. The resulting serial data output signal is applied to transmitter output driver 230. Output driver 230 converts the single-ended signal it receives to a differential signal pair that is applied to serial data output pins or terminals 240.

FIG. 2 further shows that as a possible alternative to each channel 200 using its own clock generation circuitry 210 to generate its own word-rate clock signal (CLK_DIVTX), a similar signal (TX_CLK) can be generated centrally (e.g., for use by multiple channels 200). This can be done by clock generation circuitry 110 in CMU 100. Like circuitry 210, circuitry 110 can divide the frequency of the output signal of CMU 30 by a selectable factor such as 4 or 5. The resulting word-rate output signal is always applied to downstream circuitry via lead 112. It is also frequency-divided by 2 (among other possibilities) by circuitry 120 (similar to circuitry 80). Mux 130 (similar to mux 90) can select either the frequency-divided signal or the frequency-undivided signal to be the TX_CLK signal for application to the downstream PCS circuitry. Like mux 90, switching of mux 130 is controlled (with regard to final timing) by de-glitch circuit 150b. This avoids glitches in the TX_CLK signal in the same way that glitches are avoided in the output signal of mux 90.

(Although not shown in FIG. 2 to avoid unduly complicating the drawing, leads from CMU 30 to elements 110 and 210 may actually be four parallel circuits. Each of these circuits may convey a respective one of four clock signals, each having a respective one of four phases that are spaced from one another by 90°. (Except for the above-mentioned differences in phase, these four signals may be identical to one another.) Four such signals at 2.5 GHz may be needed (e.g., by circuitry 210) to clock the serial data output side of serializer 220 at 5 GBPS. Accordingly, there may be four instances of elements 80, 90, and 150a, one for each of the four phases from CMU 30.)

Before leaving FIGS. 1 and 2, it should be pointed out that there is typically a fundamental difference between frequency dividers like 70, 110, or 210, on the one hand, and frequency dividers like 80/90 or 120/130, on the other hand. Frequency dividers like 70 divide the frequency of the applied signal by a static or relatively static factor. For example, such a factor may be programmed into the divider or programmably selected for use by the divider. Such programming is typically performed during initial configuration of the device that includes this circuitry. Such configuration typically takes place prior to normal operating mode operation of the device. Thereafter, during subsequent normal operation of the device, it is not possible to change such a programmably selected frequency division factor. If it is desired to change this factor, it is typically necessary to stop normal operation of the device so that the device can be re-programmed or re-configured. Then normal operation can be restarted using the new frequency division factor.

Figure 8:
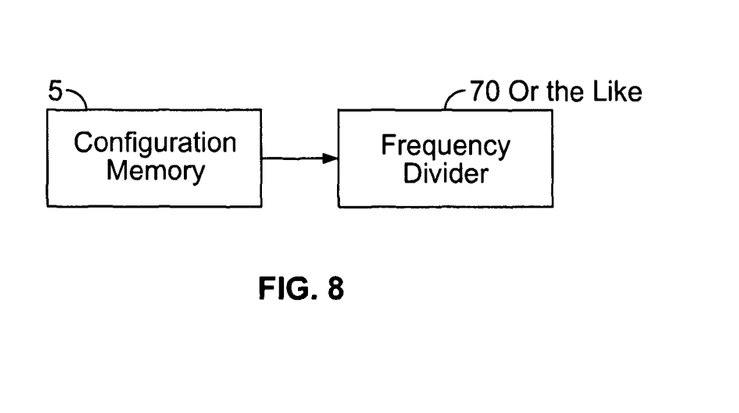
FIG. 8 is a simplified block diagram of illustrative circuitry that can be used for certain components in earlier FIGS.
Figure 9:
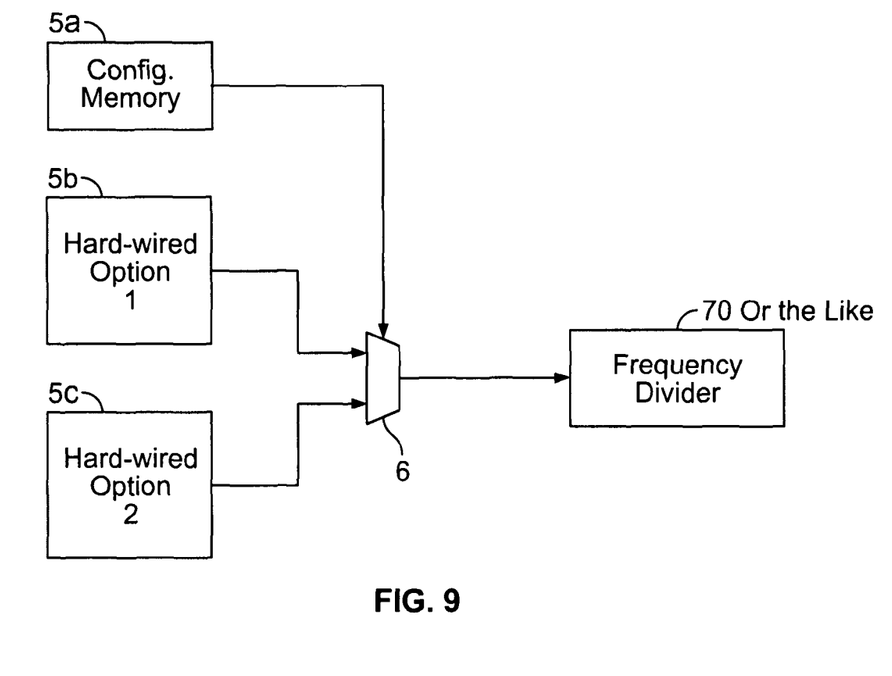
FIG. 9 is a simplified block diagram of an illustrative alternative to what is shown in FIG. 8.

FIGS. 8 and 9 show a couple of examples of programmably selectable frequency division factors. In FIG. 8 the desired frequency division factor is programmed into configuration memory 5 and thereafter used by frequency divider 70 or the like as the factor by which that circuitry divides the frequency of an applied signal. In FIG. 9 two (or more) frequency division factors are hard-wired into the circuitry at 5b and 5c. Mux 6 can select either of these factors for use by frequency divider 70 or the like. The selection made by mux 6 is controlled by how configuration memory 5a is programmed during configuration of the device.

Figure 10:
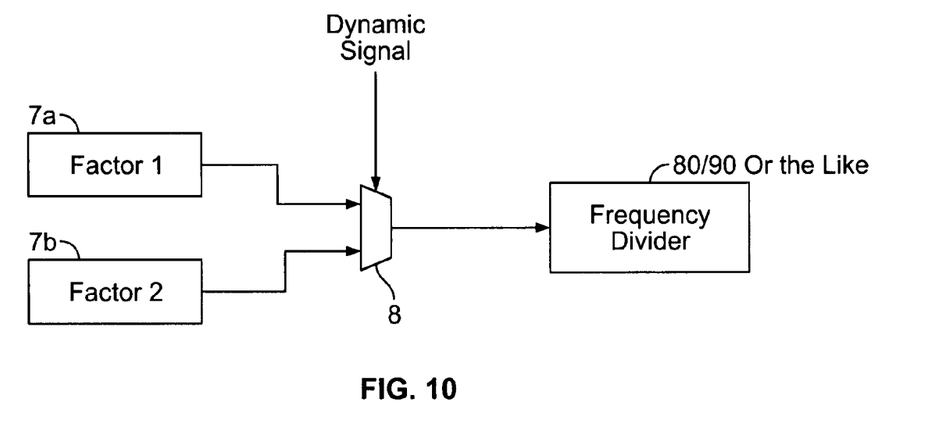
FIG. 10 is a simplified block diagram of illustrative circuitry that can be used for certain other components in earlier FIGS.
Figure 11:
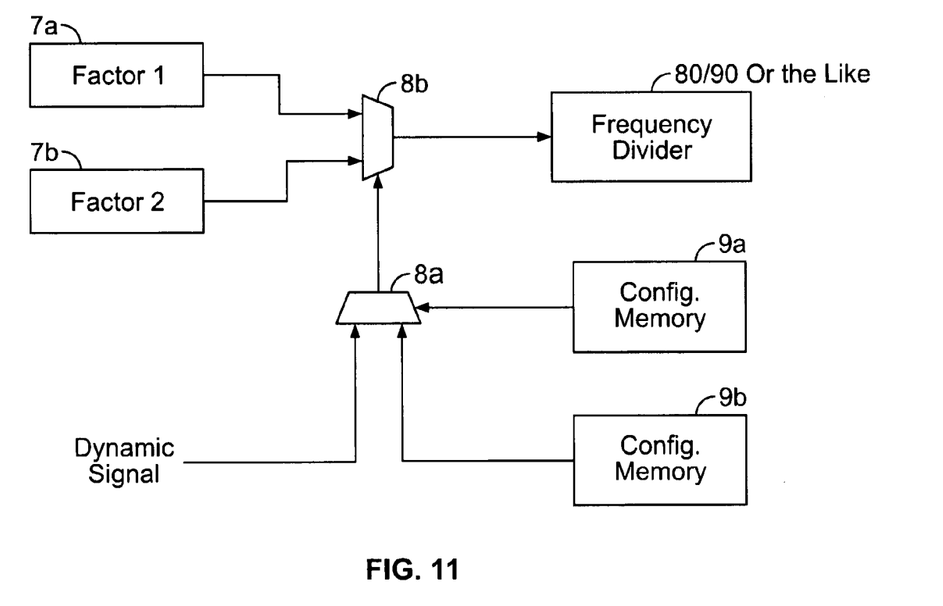
FIG. 11 is a simplified block diagram of an illustrative alternative to what is shown in FIG. 10.

In contrast to such static or relatively static, programmable selection of a frequency division factor (e.g., as in FIG. 8 or FIG. 9), FIGS. 10 and 11 show a couple of examples of dynamic or relatively dynamic frequency division factor selection. The "dynamic signal" in these Figs. is a signal that can change during normal operation of the device that includes this circuitry. In FIG. 10 mux 8 is controlled by the dynamic signal to select either of two (or more) frequency division factors 7a and 7b for use by frequency divider 80/90 or the like circuitry with dynamic frequency selection capability. Factors 1 and 2 (7a and 7b) may be hard-wired options, programmable options, or the like. FIG. 11 is similar except that in FIG. 11 the circuitry can operate with either dynamic frequency selection as in FIG. 10 or with programmable frequency selection as in FIG. 8 or FIG. 9. For dynamic frequency selection, configuration memory 9a is programmed to cause mux 8a to apply the dynamic signal to the selection control input terminal of mux 8b. For static (programmable) frequency selection, configuration memory 9b is programmed to make the desired selection, and configuration memory 9a is programmed to cause mux 8a to apply that selection to the selection control input terminal of mux 8b.

The various embodiments shown in FIGS. 8-11 are only examples, but they will serve to illustrate what is generally meant by programmable selection (e.g., FIGS. 8 and 9) vs. dynamic selection (e.g., FIGS. 10 and 11 (option using the dynamic signal)) of a frequency division factor or another signal, circuit option, or the like.

Figure 3:
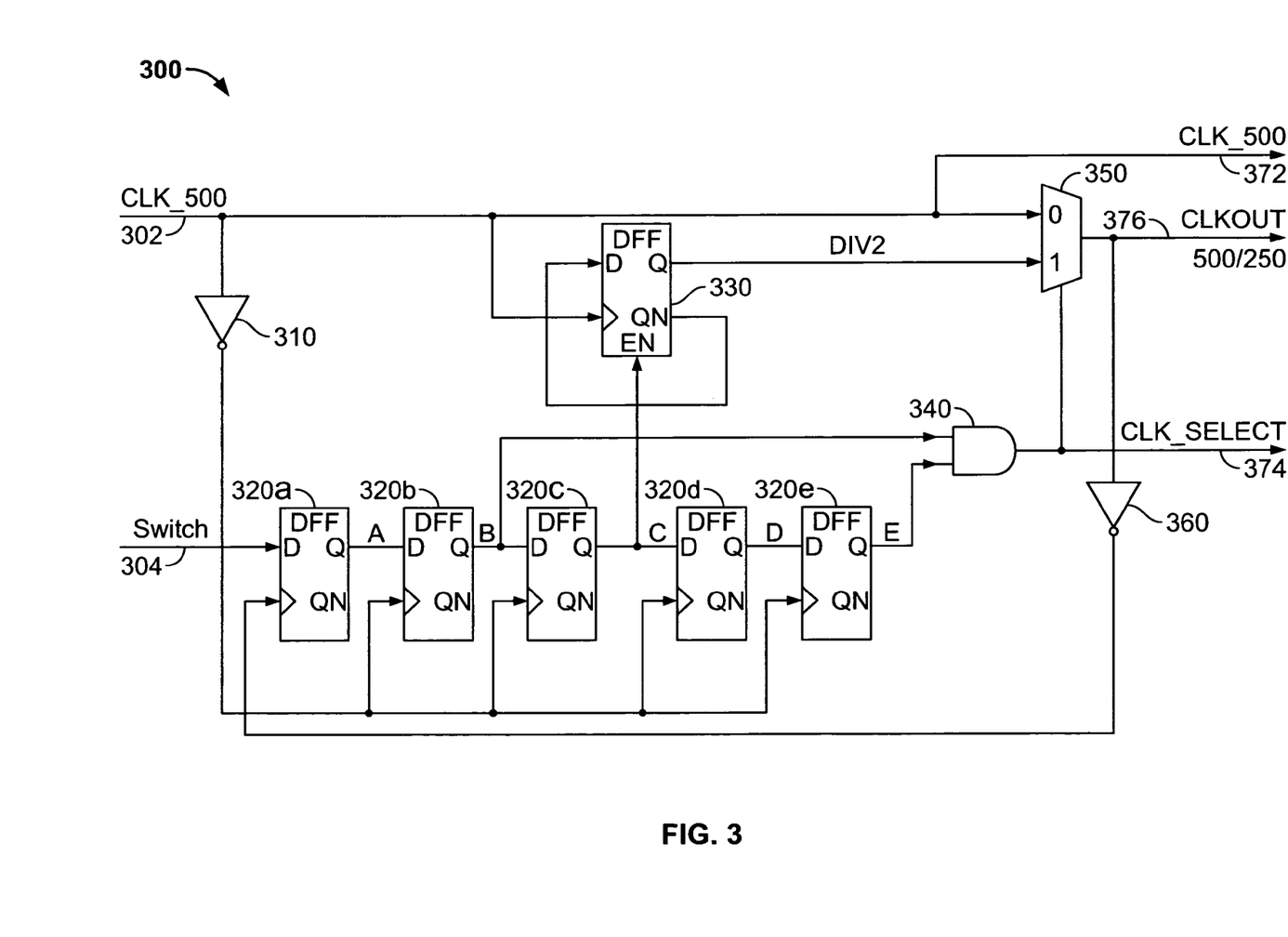
FIG. 3 is a simplified block diagram of an illustrative embodiment of still more circuitry in accordance with the invention.
Figure 4:
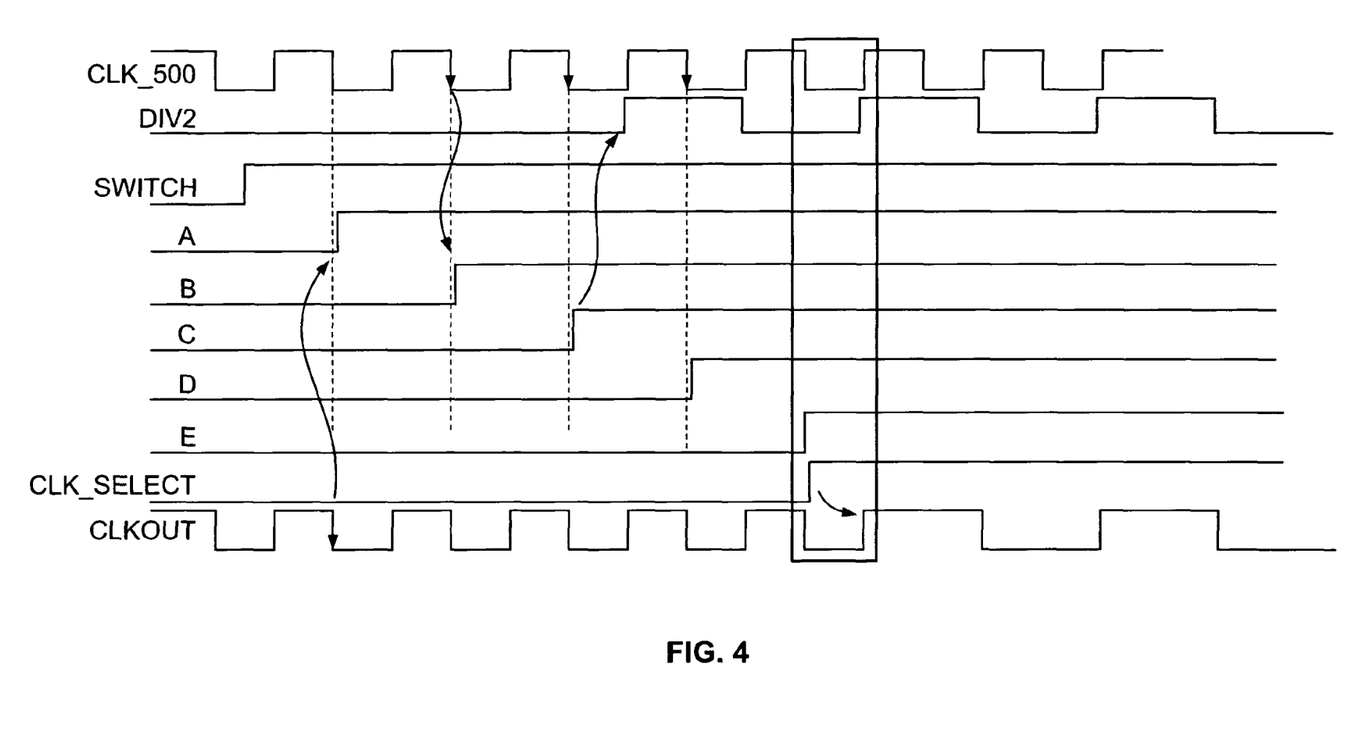
FIG. 4 is a simplified set of signal waveforms that illustrate operation of the FIG. 3 circuitry under certain conditions.
Figure 5:
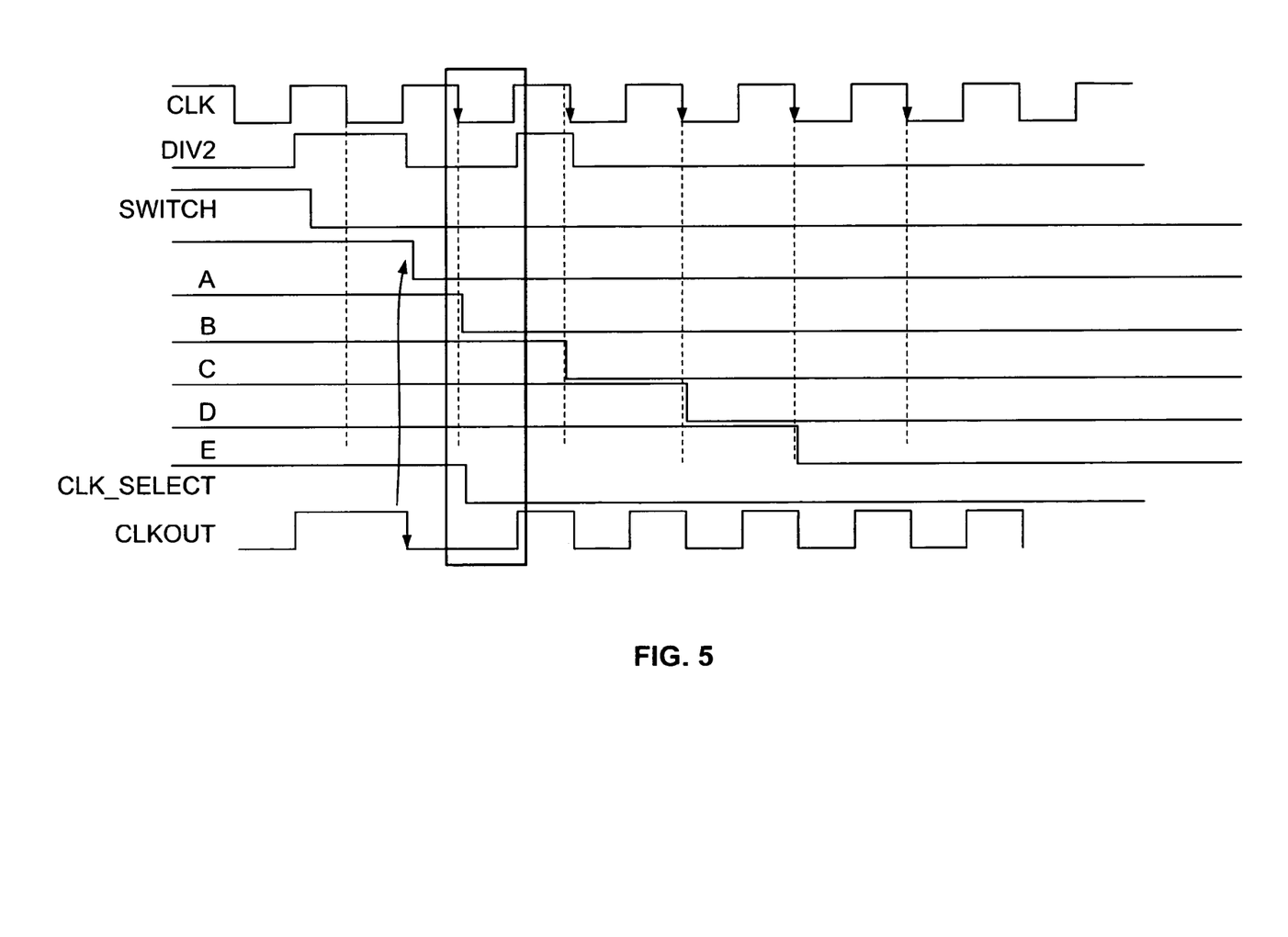
FIG. 5 is similar to FIG. 4, but for other conditions of the FIG. 3 circuitry.

It is mentioned above that it is desirable to be able to switch between different clock frequencies in a glitchless manner. An illustrative embodiment of circuitry 300 for doing this is shown in FIGS. 3, and FIGS. 4 and 5 show waveforms that illustrate the operation of the FIG. 3 circuitry under various operating conditions. FIGS. 3-5 refer to an example in which the two clock signal frequencies between which glitchless switching can be performed are 250 MHz and 500 MHz, but it will be understood that this is only illustrative and that different frequencies can be used instead if desired.

The elements of circuitry 300 shown in FIG. 3 are inverter 310, flip-flops 320a-320e (connected with one another in series), flip-flop 330 (which performs a divide-by-2 function like that performed by element 120 in FIG. 2, for example), AND gate 340, multiplexer 350 (which performs a function like that performed by mux 130 in FIG. 2, for example), and inverter 360. A signal at the higher of the two frequencies that circuitry 300 can switch between is applied to lead 302. In the illustrative example that is specifically referred to in FIG. 3, the signal on lead 302 is a clock signal at 500 MHz. This signal is applied to one of the two selectable inputs of multiplexer 350. It is also used to clock flip-flop 330 and, after inversion by inverter 310, to clock flip-flops 320b-e. The signal on lead 320 is also always available as an output of circuitry 300 via lead 372 (which can be like lead 112 in FIG. 2, for example).

The signal that controls whether circuitry 300 outputs the high frequency (e.g., 500 MHz) or the low frequency (e.g., 250 MHz) is applied to circuitry 300 via lead 304. This signal (which can be like the PCIE switch signal in FIG. 2, for example) is high when the low frequency output is requested. It is low when the high frequency output is requested.

The inverted data output of flip-flop 330 is applied to the data input of that flip-flop. Accordingly, when flip-flop 330 is enabled (by the data output ("C") of flip-flop 320c), it acts to produce a clock output signal ("DIV2") having half the frequency of the signal applied to its clock input terminal. The DIV2 output signal of flip-flip 330 is applied to the second selectable input of multiplexer 350.

The two inputs to AND gate 340 are the data output ("B") of flip-flop 320b and the data output ("E") of flip-flop 320e. The output signal of AND gate 340 is applied to multiplexer 350 as a selection control signal. When the output of AND gate 340 is low, multiplexer 350 outputs on lead 376 the higher frequency signal from lead 302. When the output of AND gate 340 is high, multiplexer 350 outputs on lead 376 the lower frequency signal ("DIV2") produced by flip-flop 330. The output signal of AND gate 340 is also output by circuitry 300 via lead 374 so that circuitry 300 can indicate to other circuitry which clock frequency (high or low) it is now outputting via lead 376.

The output of multiplexer 350 on lead 376 is used (after inversion by inverter 360) to clock flip-flop 320a.

FIG. 4 illustrates how circuitry 300 operates to glitchlessly switch from outputting a high-frequency clock to outputting a low-frequency clock. FIG. 5 illustrates how circuitry 300 operates to glitchlessly switch from outputting a low-frequency clock to outputting a high-frequency clock. Basically, in either case, after a request to change frequency is received (as indicated by a change in the state of the "switch" signal on lead 304), circuitry 300 waits until the high frequency signal switches to a given polarity (e.g., the lower of its two possible voltage levels) while the low frequency signal already has that same polarity. Then the selection being made by multiplexer 350 is allowed to change. This allows the output of multiplexer 350 to be glitchless.

Elaborating on the preceding in the case of FIG. 4, after the switch signal changes from low to high, the new value of that signal is clocked into flip-flop 320a and becomes output A. This high value of output A is successively clocked into and output by flip-flops 320b-e. When this high value becomes the output of flip-flop 320c, flip-flop 330 is enabled to begin producing the DIV2 signal. When the high value finally reaches the output of flip-flop 320e (inside the rectangle in FIG. 4), it is known that both the high-frequency signal on lead 302 and the DIV2 signal are low, and also that the low-frequency signal had already been low for some time before the high-frequency signal went low. Accordingly, conditions are satisfactory for a glitchless frequency change. Both inputs to AND gate are thus now high, which causes multiplexer 350 to glitchlessly switch from outputting the high-frequency clock (from lead 302) to outputting the low-frequency clock (from flip-flop 330).

Elaborating on the preceding in the case of FIG. 5, after the switch signal changes from high to low, the new value of that signal is clocked into flip-flop 320a and becomes output A. This low value of output A is successively clocked into and output by flip-flops 320b-e. When this low value becomes the output of flip-flop 320b, it is known that both of the high- and low-frequency clocks are low, and also that the low-frequency clock had already been low for some time before the high-frequency clock went low. Conditions are therefore satisfactory for a glitchless transition from low to high frequency in the clock output of circuitry 300. The now-low output of flip-flop 320b causes the output of AND gate 340 to go low, which causes multiplexer 350 to switch from outputting the low-frequency clock (DIV2) to outputting the high-frequency clock (from lead 302). Shortly thereafter flip-flop 330 is disabled, which terminates the production of a meaningful DIV2 signal. Disabling flip-flop 330 in this way when DIV2 is not needed saves power.

Figure 6:
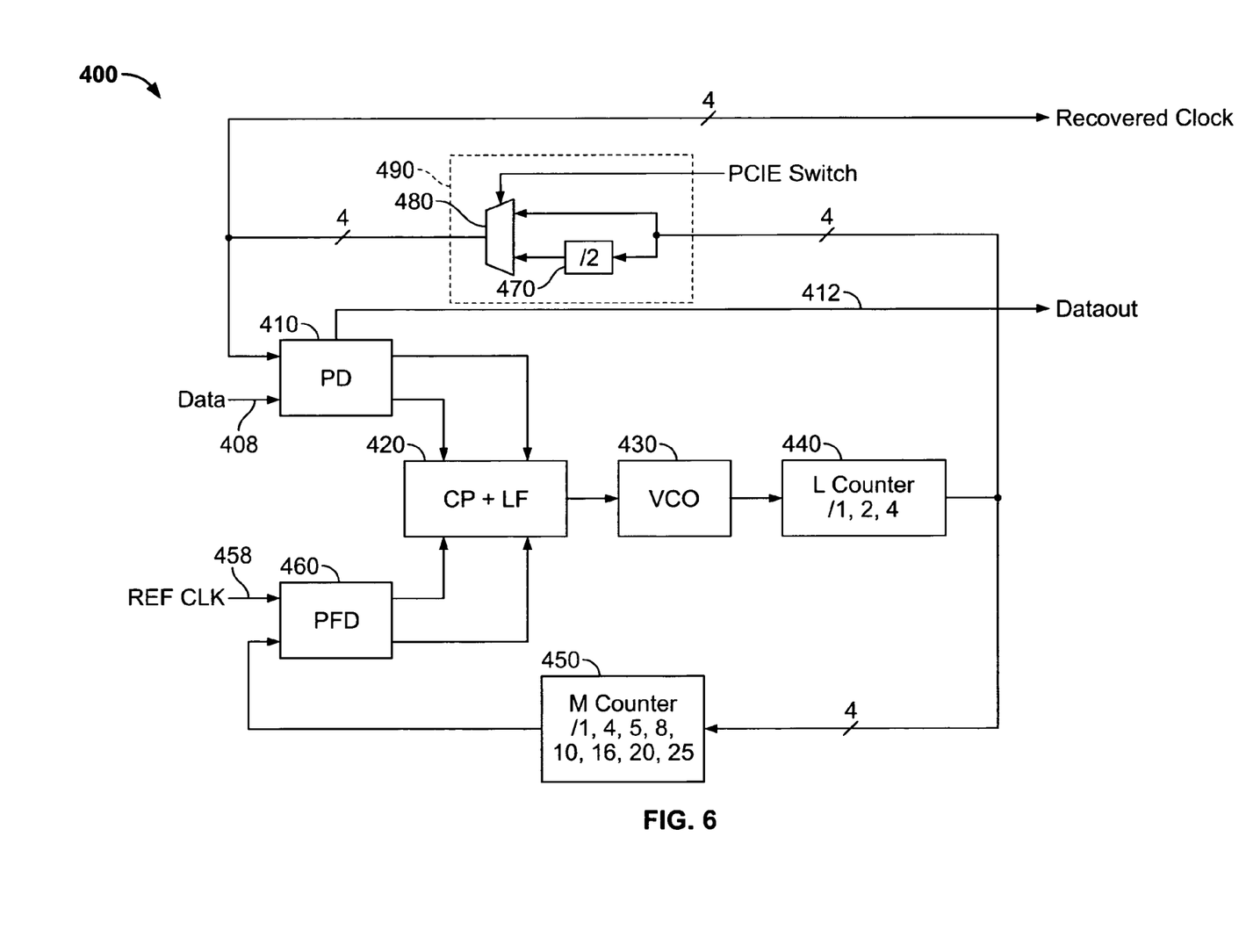
FIG. 6 is a simplified block diagram of an illustrative embodiment of yet more circuitry in accordance with the invention.

FIG. 6 shows an illustrative embodiment of receiver circuitry 400 in accordance with the invention. Like the transmitter circuitry described earlier in this specification, receiver circuitry 400 can switch very rapidly (and with no reconfiguration of the circuitry being required) between data reception at two different serial data rates (e.g., 5 GBPS and 2.5 GBPS).

The circuitry shown in FIG. 5 is basically similar to circuitry shown in FIG. 3 of the above-mentioned Shumarayev et al. reference, with the addition of elements 470 and 480. The description of the previously disclosed parts of this circuitry can therefore be somewhat abbreviated. A received serial data signal is applied to one input of phase detector 410 via lead 408. For example, this serial data signal may have a serial data rate of either 2.5 GBPS or 5 GBPS. A reference clock signal is applied to one input of phase and frequency detector 460 via lead 458. For example, this reference clock signal may have a frequency of 100 MHz.

Phase detector 410 compares the phase of the signal on lead 408 to the phase of a feedback signal it receives from multiplexer 480. Phase detector 410 produces "up" or "down" output signals to indicate whether the signal from mux 480 needs to be speeded up or slowed down to better match the phase of the signal on lead 408. These "up" and "down" signals are applied to charge pump and loop filter 420.

Circuitry 460 compares the phase and frequency of the signal on lead 458 to the phase and frequency of a feedback signal it receives from counter 450. Circuitry 460 produces "up" or "down" output signals to indicate whether the signal from counter 450 needs to be speeded up or slowed down to better match the phase and frequency of the signal on lead 458. These "up" and "down" signals are also applied to charge pump and loop filter 420.

Circuitry 420 basically integrates the various "up" and "down" signals it receives, and on that basis it produces an output signal for controlling the frequency of oscillation of voltage controlled oscillator 430. The oscillatory output signal of VCO 430 is applied to frequency divider (counter) 440, which can divide the oscillator output signal frequency by a programmably selectable factor such as 1, 2, or 4. The output signal of counter 440 is applied to one selectable input of mux 480, to divider 470, and to counter 450. Counter 450 can divide the frequency of the signal it receives by a programmably selectable factor such as 1, 4, 5, 8, 10, 16, 20, or 25. Divider 470 divides the frequency of the signal it receives by 2 and applies the resulting signal to the second selectable input of mux 480. Mux 480 is controllable by a selection control input signal "PCIE switch" to select one of its two primary input signals (as indicated by the state of the "PCIE switch" signal) to be its output signal. As was the case for this type of signal earlier in this specification, the PCIE switch signal can be a dynamic or relatively dynamic signal (in contrast to the more static, programmable control that is used for selection of the frequency division factors employed by L counter 440 and M counter 450).

In addition to being a phase detector, circuitry 410 also include a data latch. This data latch is clocked by the signal fed back from mux 480 (or a signal based on that feedback signal) to sample the serial data input signal from lead 408. The output signal 412 of this data latch is a recovered serial data signal, which can be applied to other downstream circuitry. For example, this other downstream circuitry can include deserializer circuitry for deserializing the recovered serial data signal to produce parallel data for use by still further downstream circuitry such as the programmable logic circuitry on a programmable logic device ("PLD") that includes receiver circuitry 400. The output signal of mux 480 is also applied to this downstream circuitry as a recovered clock signal. This recovered clock signal can be used for such purposes as timing the operations of the above-mentioned deserializer circuitry and (after further frequency division) clocking the parallel data output by the deserializer into further downstream circuitry (such as that which is also mentioned above).

Figure 7:
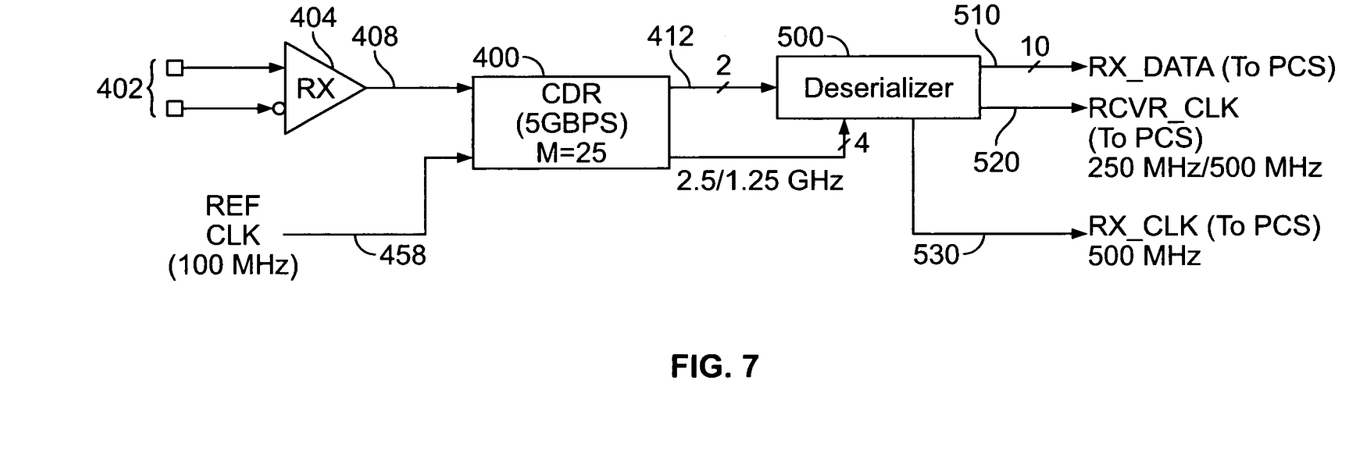
FIG. 7 is a simplified block diagram of an illustrative embodiment of still more circuitry in accordance with the invention.

FIG. 7 shows, at a somewhat higher level, clock and data recovery circuitry of the type shown in FIG. 6 (now referred to as CDR circuitry 400) in a larger context. In particular, FIG. 7 shows reception of a serial data signal in differential form via pins 402. Input buffer 404 converts the differential signals to single-ended signal 408 for application to CDR circuitry 400. Reference clock signal 458 is also applied to CDR circuitry 400. CDR circuitry 400 outputs the data signal 412 it has recovered for application to deserializer 500. (To slow down the rate of transfer to deserializer 500, CDR 400 is shown in FIG. 7 outputting two recovered data signals 412 in parallel. These two signals are alternate ("odd" and "even") bits recovered from the incoming serial data signal. This also allows the recovered clock signal from CDR 400 to deserializer 500 to be at a lower frequency than the original serial data bit rate (i.e., 2.5 GHz when the original serial data rate is 5 GBPS, or 1.25 GHz when the original serial data rate is 2.5 GBPS).

Deserializer 500 deserializes the data on leads 412 to as many as 10 parallel bits of data on leads 510. Deserializer 500 also outputs a clock signal on lead 520 that is synchronized with the parallel data on leads 510. For example, when the original serial data is at 5 GBPS, the signal on lead 520 may be at 500 MHz. When the original serial data is at 2.5 GBPS, the signal on lead 520 may be at 250 MHz. Deserializer 500 may also output another clock signal on lead 530 which is always at 500 MHz. As was mentioned earlier, the signals on leads 510, 520, and 530 may be applied to further downstream circuitry that makes use of the data and that is clocked by the clock signals (e.g., in order to further process the data).

FIGS. 6 and 7 and the above discussion of those FIGS. is simplified by not referring to the possible fact that VCO 450 may actually produce four output signals, all having the same frequency but each having a different phase. These four phases can be 90° apart so that they are equally spaced across a cycle of any of these signals that is arbitrarily chosen as a reference. The four phase-distributed signals that are output by VCO 430 may be processed in parallel to the circuitry that is downstream from the VCO. These signals can be used in different ways by some of these downstream components (e.g., at any given time, different ones of these signals can be used for phase comparison(s) and for data sampling (i.e., to produce recovered data output signal(s) 412)). These concepts are well known to those skilled in the art and do not need to be detailed further in this specification.

In accordance with the present invention, elements 470 and 480 make it possible for the serial data receiver circuitry of FIGS. 6 and 7 to switch very rapidly in either direction between a relatively high serial data rate (e.g., 5 GBPS) and a relatively low serial data rate (e.g., 2.5 GBPS) with no requirement for reconfiguring the circuitry. To keep the device from having to be reconfigured, the CDR unit (FIGS. 6 and 7) is configured for the highest data-rate setting of the multi-rate communication protocol being served (e.g., 5 GBPS for PCI Express Generation 2). The reference clock 458 is kept unchanged (e.g., 100 MHz) for the highest data rate setting of the protocol. The "PCIE switch" signal (applied to mux 480) indicates a change in data rate. The recovered clock signal 530 sent to the downstream circuitry can be at the highest parallel data rate (500 MHz in PCEI Gen-2), and on lead 520 at either of two different data rates (500 MHz when supporting the higher data rate of PCEI Gen-2, or 250 MHz when supporting the lower data rate of PCEI Gen-1). A de-glitch circuit is also required. For example, the circuitry inside dotted line 490 can be constructed as shown in FIG. 3 to enable that circuitry to switch glitchlessly between the high and low frequencies. In such an embodiment, flip-flop 330 in FIG. 3 would perform the function of divider 470, mux 350 in FIG. 3 would perform the function of mux 480, and the other elements and connections in FIG. 3 would be added to give circuitry 490 glitchless operation.

It will be understood that the foregoing is only illustrative of the principles of the invention, and that various modifications can be made by those skilled in the art without departing from the scope and spirit of the invention. For example, the serial data rates and clock frequencies mentioned herein are only illustrative, and other data rates and clock frequencies can be used instead if desired.

The invention claimed is:

1. Circuitry for receiving a high-speed serial data signal having any one of a plurality of different possible data rates comprising:
    circuitry for producing an oscillating signal of controllably variable frequency;
    first circuitry for dividing frequency of the oscillating signal by a first programmably selectable factor to produce a feedback input signal;
    a first feedback loop for comparing phase and frequency of a first signal derived from the feedback input signal to phase and frequency of a reference clock signal to produce a first control signal for indicating to the circuitry for producing how the frequency of the oscillating should be changed to improve a result of the comparing phase and frequency; and
    a second feedback loop for comparing phase of the serial data signal to phase of a second signal derived from the feedback input signal to produce a second control signal for indicating to the circuitry for producing how the frequency of the oscillating signal should be changed to improve a result of the comparing phase, wherein:
    the second feedback loop includes second circuitry for dividing frequency of the feedback input signal by a second dynamically selectable factor to produce the second signal, each possible value of the dynamically selectable factor being appropriate for use with a respective one of the possible data rates; and
    the second circuitry comprises circuitry for receiving a frequency selection control signal that can request a change in the dynamically selectable factor, and for controlling timing of effecting that change to avoid glitches in the second signal.

2. The circuitry defined in claim 1 wherein the dynamically selectable factor is one or two.

3. The circuitry defined in claim 1 wherein the second circuitry comprises:
    a multiplexer having first and second selectable inputs, an output, and a selection control input to which a selection control signal is applied to control which of the selectable inputs is connected to the output, the feedback input signal being connected to the first selectable input; and
    a frequency divider circuit for dividing the frequency of the feedback input signal by a predetermined factor greater than one, and for applying a resulting signal to the second selectable input.

4. The circuitry defined in claim 3 wherein the predetermined factor is two.

5. The circuitry defined in claim 1 further comprising:
circuitry for using a signal derived from the second signal to sample the serial data signal to produce a recovered version of the serial data signal.

6. The circuitry defined in claim 5 further comprising:
circuitry for deriving a recovered clock signal from the second signal; and
circuitry for using the recovered clock signal to process the recovered version of the serial data signal.

7. The circuitry defined in claim 6 wherein the circuitry for using comprises:
deserializer circuitry for deserializing the recovered version of the serial data signal.

8. The circuitry defined in claim 1 wherein the first feedback loop comprises:
third circuitry for dividing frequency of the feedback input signal by a third programmably selectable factor to produce the first signal.

9. The circuitry defined in claim 1 wherein the circuitry for producing comprises voltage-controlled oscillator circuitry.

10. Circuitry for transmitting a high-speed serial data signal at anyone of a plurality of different possible data rates comprising;
a source of a reference clock signal;
circuitry for producing an oscillating signal of controllably variable frequency;
a feedback loop for comparing phase and frequency of the reference clock signal and the oscillating signal to produce a control signal for indicating to the circuitry for producing how the frequency of the oscillating signal should be changed to improve a result of the comparing;
circuitry that is not connected in the feedback loop for dividing the frequency of the oscillating signal by a dynamically selectable factor to produce a data clock signal, comprising:
circuitry for selecting between (1) the oscillating signal, and (2) an alternate signal that corresponds to the oscillating signal after frequency division by the dynamically selectable factor, and
circuitry for controlling timing of change in frequency of the data clock signal to avoid glitches in the data clock signal; and
circuitry for transmitting data at a rate determined by the data clock signal.

11. The circuitry defined in claim 10 wherein the feedback loop includes frequency divider circuitry for dividing the frequency of the oscillating signal by a programmably selectable factor upstream from the comparing.

12. The circuitry defined in claim 10 wherein the circuitry for producing comprises voltage-controlled oscillator circuitry.

13. The circuitry defined in claim 10 wherein the dynamically selectable factor can have a value of one or two.

14. The circuitry defined in claim 10 wherein the circuitry for controlling is responsive to polarities of the oscillating signal and the alternate signal.

15. The circuitry defined in claim 14 wherein the circuitry for controlling allows the circuitry for selecting to change its selection only after the oscillating signal has changed to a first polarity while the alternate signal already has the first polarity.

16. The circuitry defined in claim 15 wherein, when the circuitry for controlling allows the circuitry for selecting to change its selection, the circuitry for controlling causes the circuitry for selecting to effect that change while the oscillating signal and the alternate signal both still have the first polarity.

17. Circuitry for glitchlessly selecting between a high frequency clock signal and a low frequency clock signal to produce an output clock signal, the high and low frequency clock signals being substantially synchronized in phase, comprising:
a plurality of serially connected flip-flops, a first of the flip-flops in the series being clocked by the output clock signal, and all of the other flip-flops in the series being clocked by the high frequency clock signal;
circuitry for applying to the first flip-flop a selection request signal indicative of which of the high and low frequency clock signals it is currently desired to select;
logic circuitry for logically combining output signals of two of the other flip-flops to produce a selection control signal that indicates whether the high or low frequency clock signal should be selected; and
circuitry for selecting as the output clock signal the high or low frequency clock signal that the selection control signal indicates should be selected.

18. The circuitry defined in claim 17 further comprising:
circuitry for producing the low frequency clock signal from the high frequency clock signal by subjecting the high frequency clock signal to frequency division by a frequency division factor.

19. The circuitry defined in claim 18 wherein the frequency division factor is 2.

20. The circuitry defined in claim 17 wherein the circuitry for producing is enabled substantially only when the selection request signal indicates that the low frequency clock signal is currently desired for selection.

21. The circuitry defined in claim 20 wherein enablement of the circuitry for producing is controlled by an output signal of one of the other flip-flops.

22. The circuitry defined in claim 21 wherein the flip-flop whose output signal controls enablement of the circuitry for producing is intermediate the two flip-flops whose output signals are logically combined by the logic circuitry.

23. The circuitry defined in claim 17 wherein the circuitry for selecting comprises a multiplexer whose selectable inputs are, respectively, the high and low frequency clock signals, and whose selection control input is the selection control signal.

* * * * *